(12) United States Patent
Lu et al.

(10) Patent No.: US 10,224,238 B2
(45) Date of Patent: Mar. 5, 2019

(54) ELECTRICAL COMPONENTS HAVING METAL TRACES WITH PROTECTED SIDEWALLS

(71) Applicant: Apple Inc., Cupertino, CA (US)

(72) Inventors: Chang Ming Lu, Taoyuan (TW); Chia-Yu Chen, Taoyuan (TW); Chih Pang Chang, Taoyuan (TW); Ching-Sang Chuang, Sunnyvale, CA (US); Hung-Che Ting, Taoyuan (TW); Jung Yen Huang, Taipei (TW); Sheng Hui Shen, Taoyuan (TW); Shih Chang Chang, Cupertino, CA (US); Tsung-Hsiang Shih, Taoyuan (TW); Yu-Wen Liu, Taoyuan (TW); Yu Hung Chen, Pingchen (TW); Kai-Chieh Wu, Taipei (TW); Lun Tsai, Taoyuan (TW); Takahide Ishii, Taoyuan (TW); Chung-Wang Lee, Longtan (TW); Hsing-Chuan Wang, Taoyuan (TW); Chin Wei Hsu, Chuibei (TW); Fu-Yu Teng, Longtan (TW)

(73) Assignee: Apple Inc., Cupertino, CA (US)

( * ) Notice: Subject to any disclaimer, the term of this patent is extended or adjusted under 35 U.S.C. 154(b) by 28 days.

(21) Appl. No.: 15/268,106

(22) Filed: Sep. 16, 2016

(65) Prior Publication Data
US 2017/0294499 A1 Oct. 12, 2017

Related U.S. Application Data

(60) Provisional application No. 62/321,640, filed on Apr. 12, 2016.

(51) Int. Cl.
*H01L 21/768* (2006.01)
*H01L 21/02* (2006.01)
(Continued)

(52) U.S. Cl.
CPC .... *H01L 21/76834* (2013.01); *H01L 21/0273* (2013.01); *H01L 21/02244* (2013.01);
(Continued)

(58) Field of Classification Search
None
See application file for complete search history.

(56) References Cited

U.S. PATENT DOCUMENTS 6,548,393 B1   4/2003  Lin
7,763,921 B2 *  7/2010  Wang ................ H01L 21/2855
                                                257/295

(Continued)

*Primary Examiner* — Andres Munoz
(74) *Attorney, Agent, or Firm* — Treyz Law Group, P.C.; G. Victor Treyz; David K. Cole

(57) ABSTRACT

A component such as a display may have a substrate and thin-film circuitry on the substrate. The thin-film circuitry may be used to form an array of pixels for a display or other circuit structures. Metal traces may be formed among dielectric layers in the thin-film circuitry. Metal traces may be provided with insulating protective sidewall structures. The protective sidewall structures may be formed by treating exposed edge surfaces of the metal traces. A metal trace may have multiple layers such as a core metal layer sandwiched between barrier metal layers. The core metal layer may be formed from a metal that is subject to corrosion. The protective sidewall structures may help prevent corrosion in the core metal layer. Surface treatments such as oxidation, nitridation, and other processes may be used in forming the protective sidewall structures.

12 Claims, 17 Drawing Sheets

(51) Int. Cl.
*H01L 21/027* (2006.01)
*H01L 21/77* (2017.01)

(52) U.S. Cl.
CPC .. *H01L 21/02252* (2013.01); *H01L 21/02255* (2013.01); *H01L 21/7685* (2013.01); *H01L 21/76877* (2013.01); *H01L 21/77* (2013.01)

(56) References Cited

U.S. PATENT DOCUMENTS

| | | | |
|---|---|---|---|
| 2004/0097024 A1* | 5/2004 | Doi | H01L 29/41733 |
| | | | 438/151 |
| 2005/0224977 A1* | 10/2005 | Yoshimura | H01L 21/76838 |
| | | | 257/751 |
| 2008/0237863 A1* | 10/2008 | Toyoda | H01L 21/76834 |
| | | | 257/751 |
| 2009/0051036 A1 | 2/2009 | Abbott | |
| 2009/0250821 A1 | 10/2009 | Borthakur | |
| 2010/0022086 A1 | 1/2010 | Choi et al. | |
| 2010/0184285 A1 | 7/2010 | Hua et al. | |
| 2015/0097292 A1* | 4/2015 | He | H01L 21/76834 |
| | | | 257/768 |
| 2016/0300804 A1* | 10/2016 | Omori | H01L 21/76855 |

\* cited by examiner

ELECTRICAL COMPONENTS HAVING
METAL TRACES WITH PROTECTED
SIDEWALLS

This application claims the benefit of provisional patent application No. 62/321,640, filed Apr. 12, 2016, which is hereby incorporated by reference herein in its entirety.

BACKGROUND

This relates generally to metal structures, and, more particularly, to metal traces in displays and other components.

Thin-film transistor circuitry is used in displays and other components. For example, an organic light-emitting diode display or a liquid crystal display may have an array of pixels that include thin-film transistors and other pixel circuit components.

Metal structures such as metal traces for bond pads and interconnect lines may be formed using processes such as thin-film deposition, photolithography, and etching. If care is not taken, metal traces can be subject to corrosion. Corrosion may be prevented by using additional photolithographic masks and process steps to form protective structures over the metal traces during fabrication. This type of approach may involve undesired process complexity.

SUMMARY

A component such as a display may have a substrate and thin-film circuitry on the substrate. The thin-film circuitry may be used to form an array of pixels for a display or other circuit structures. Metal traces may be formed among dielectric layers in the thin-film circuitry.

The metal traces in the thin-film circuitry may be provided with insulating protective sidewall structures. The protective sidewall structures may be formed by treating exposed edge surfaces of the metal traces.

A metal trace may have multiple layers such as a core metal layer sandwiched between barrier metal layers. The core metal layer may be formed from a metal that is subject to corrosion. The protective sidewall structures may help prevent corrosion in the core metal layer. Surface treatments such as oxidation, nitridation, and other processes may be used in forming the protective sidewall structures.

DETAILED DESCRIPTION

Figure 1:
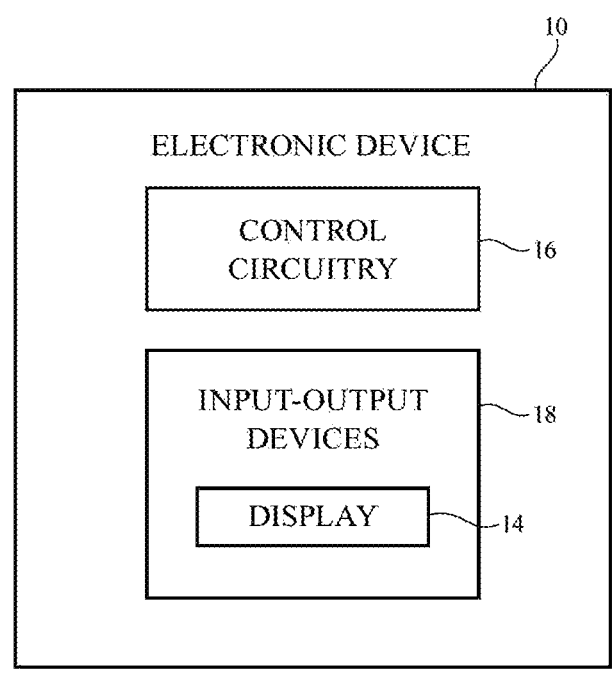
FIG. 1 is a schematic diagram of an illustrative electronic device in accordance with an embodiment.

Electronic devices may be provided with components such as displays and other components that include thin-film circuitry. A schematic diagram of an illustrative electronic device with a component such as a display with thin-film circuitry is shown in FIG. 1. Device 10 of FIG. 1 may be a computing device such as a laptop computer, a computer monitor containing an embedded computer, a tablet computer, a cellular telephone, a media player, or other handheld or portable electronic device, a smaller device such as a wrist-watch device (e.g., a watch with a wrist strap), a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. Display 14 and other components in device 10 may include thin-film circuitry.

Control circuitry 16 may be used to run software on device 10 such as operating system code and applications. During operation of device 10, the software running on control circuitry 16 may display images on display 14.

Display 14 may be an organic light-emitting diode display, a liquid crystal display, or any other suitable type of display with thin-film circuitry. Thin-film circuitry may also be used in forming other components in device 14 (e.g., touch sensors, strain gauges, gas sensors, circuitry on printed circuit substrates and/or other substrates, antenna structures, etc.).

Figure 2:
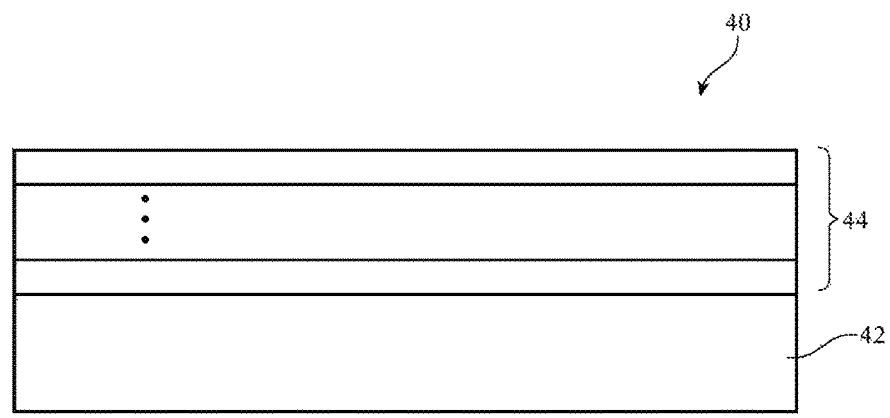
FIG. 2 is a cross-sectional side view of a component with thin-film circuitry in accordance with an embodiment.

A cross-sectional side view of an illustrative component with thin-film circuitry is shown in FIG. 2. As shown in FIG. 2, component 40 may include a substrate such as substrate 42 and thin-film layers that form thin-film circuitry 44 on substrate 42. Substrate 42 may be formed from glass, ceramic, sapphire, or other suitable substrate material. The layers of material that form thin-film circuitry 44 may include semiconductor layers (e.g., silicon layers, semiconducting-oxide layers such as indium gallium zinc oxide layers, etc.) for forming transistor active regions, may include dielectric layers (e.g., layers of silicon oxide, silicon nitride, other inorganic layers, layers of organic dielectric such as photoresist formed from photoimageable polymers and other polymer layers), and conductive layers (e.g., one or more layers of metal that may be patterned into metal traces for signal lines and/or bond pads).

Figure 3:
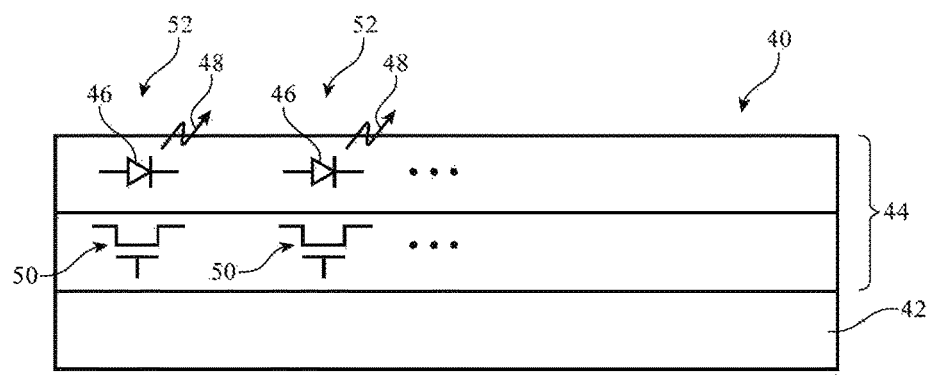
FIG. 3 is a cross-sectional side view of an illustrative organic light-emitting diode display with thin-film circuitry in accordance with an embodiment.

As shown in FIG. 3, component 40 may be an organic light-emitting diode display having an array of pixels 52 each of which includes a diode 46 that emits light 48 and one or more thin-film components such as thin-film capacitors, thin-film transistors 50, etc. The circuitry of pixels 52 (e.g., organic light-emitting diodes 46, transistors 50, etc.) may be formed from the layers of material in thin-film circuitry 44 on substrate 42 (e.g., metal traces, dielectric, etc.).

Figure 4:
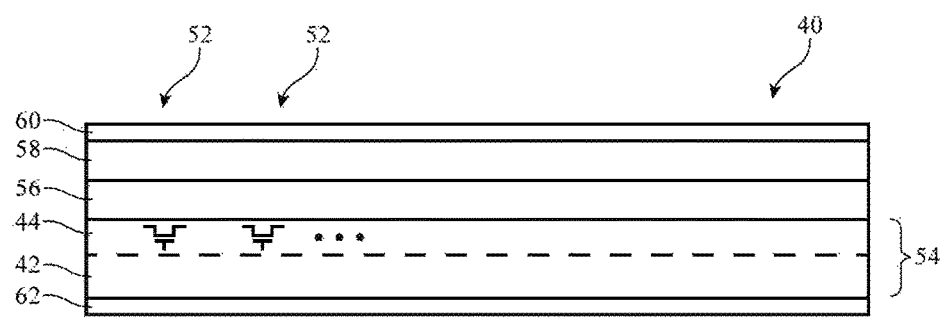
FIG. 4 is a cross-sectional side view of an illustrative liquid crystal display in accordance with an embodiment.

As shown in FIG. 4, component 40 may be a liquid crystal display. The liquid crystal display of FIG. 4 includes upper polarizer 60 and lower polarizer 62. Color filter layer 58 may have an array of color filter elements aligned with respective pixels 52 in an array of pixels. Color filter layer 58 may be used to provide the display with the ability to display color images for a user. Thin-film transistor layer 54 may include substrate 42 and thin-film circuitry 44. Thin-film circuitry 44 may form a thin-film transistor 50 for each pixel 52 and associated electrode structures (e.g., structures formed from metal traces, dielectric, etc.). Liquid crystal layer 56 may be sandwiched between color filter layer 56 and thin-film transistor layer 54.

The arrangements of FIGS. 2, 3, and 4 are presented as examples. In general, thin-film transistor circuitry 44 may be formed in any suitable type of component in device 10. Illustrative components 40 of FIGS. 2, 3, and 4 are merely illustrative.

Thin-film circuitry 44 may include metal traces that are patterned to form bond pads, signal lines in busses and other signal carrying structures. The metal traces may be formed from one or more layers of metal (e.g., elemental metals and/or metal alloys). Arrangements in which thin-film circuitry 44 includes conductive traces formed from other conductive materials may also be used, if desired.

It may be desirable to form metal traces from one or more layers of material. For example, it may be desirable to form metal traces from at least one primary current carrying highly conductive core layer such as an aluminum layer sandwiched between a pair of associated protective barrier metals (e.g., upper and lower barrier films). Core metals such as aluminum may be highly conductive, so the inclusion of aluminum (or other highly conductive metal) in the core layers of the metal traces of circuitry 44 may help lower line resistance and RC delays. Barrier metals (sometimes referred to as conductive barrier layers or barrier metal layers) may be formed from materials that are less susceptible to corrosion than the highly conductive metal of the traces and may therefore prevent corrosion on the upper and lower surfaces of the core metal layer. An examples of a barrier metal that may be used in the metal traces of circuitry 44 is titanium. Configurations in which the layer(s) of the metal traces are formed from other materials may also be used (e.g., aluminum silicide, aluminum neodymium, etc.).

To prevent corrosion to exposed edge surfaces (sometimes referred to herein as sidewalls) of the metal traces, the metal traces may be provided with protective sidewall structures. The protective sidewall structures may be formed from inorganic dielectric or other insulating material. Oxidation, nitridation, deposition of insulator from a plasma deposition tool, and/or other methods of forming the protective sidewall structures may be used to enhance the reliability of the metal traces in circuitry 44.

Figure 5:
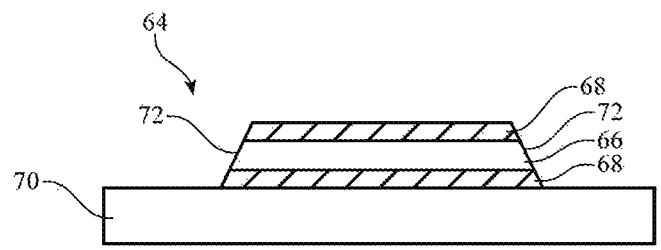
FIGS. 5, 6, and 7 are cross-sectional side views of an illustrative metal trace during the process of creating protective sidewalls on the trace by depositing and annealing an oxide layer in accordance with an embodiment.
Figure 6:
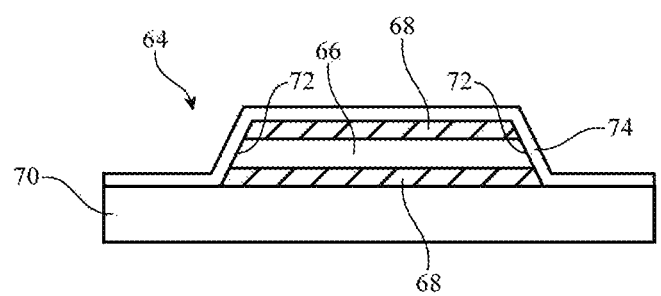
Figure 7:
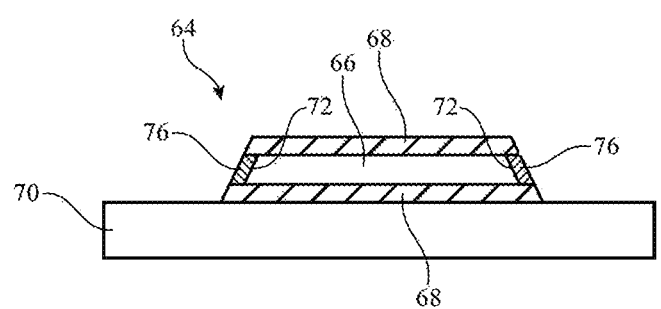

FIGS. 5, 6, and 7 are cross-sectional side views of an illustrative metal trace (metal trace 64) on supporting layer 70. Trace 64 may form a signal line that serves as an interconnect, may form a bond pad, or may form other signal paths in component 40. Supporting layer 70 may include a substrate (e.g., substrate 42 of FIGS. 2, 3, and 4) and thin-film layers (dielectric, metal, semiconductor, etc.) such as one or more of the layers of thin-film circuitry 44 (see, e.g., circuitry 44 of FIGS. 2, 3, and 4). Additional layers of thin-film circuitry 44 may be formed above trace 64 (in the configuration of FIGS. 5, 6, and 7 and other configurations), if desired.

As shown in FIG. 5, trace 64 may have a core metal layer such as core layer 66 (e.g., a layer of aluminum or other high conductivity metal). In general, trace 64 may be formed from a single layer of material 66 (e.g., a single layer of aluminum silicide, a single layer of aluminum neodymium, etc.) or may have barrier layers such as barrier layers 68 above and/or below core layer 66. Barrier layers 68 are less prone to corrosion than core layer 66 and are therefore helpful in improving the corrosion resistance of trace 64. An example of a barrier layer material (i.e., a material that may be used above and below a core layer of aluminum) is titanium. Other barrier layer materials that are less corrosive than core layer 66 may be used, if desired. Illustrative configurations for trace 64 that include upper and lower barrier layers 68 (e.g., titanium layers) on the respective upper and lower surfaces of a core layer 66 (e.g., an aluminum layer) may sometimes be described herein as an example. This is merely illustrative. Trace 64 may be formed from any suitable conductive structure.

During photolithographic patterning (e.g., etching) to form trace 64, edges (sidewall surfaces) 72 of trace 64 may be exposed. To prevent corrosion to sidewall surfaces 72 of trace 64, protective sidewall structures may be formed on surfaces 72. With the illustrative arrangement of FIGS. 5, 6, and 7, a layer of oxygen-containing material 74 (e.g., indium gallium zinc oxide or other suitable oxide layer) is deposited over metal trace 64 and surfaces 72, as shown in FIG. 6. An annealing operation may then be performed (e.g., by applying heat to layer 74 and trace 64 at an elevated temperature of about 300° C., other temperatures less than 350° C. or other suitable temperature). During annealing, oxygen from layer 74 interacts with the material of core layer 66 and oxidizes the exposed surfaces 72 of core layer 66, resulting in a protective dielectric layer (e.g., an oxide layer formed from aluminum oxide) such as protective sidewall structures 76 of FIG. 7. The portions of layer 74 that do not overlap edge surfaces 72 and that have not reacted with core layer 66 to form protective sidewalls 76 may be removed following annealing using an etchant that etches the material of layer 74 more rapidly than the material of layer 68 and the material of sidewalls 76 (e.g., an acid such as $H_2C_2O_2$).

Figure 8:
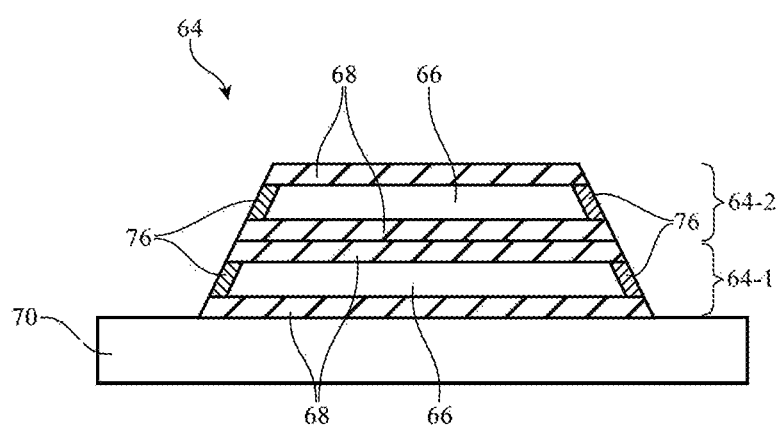
FIG. 8 is a cross-sectional side view of an illustrative multi-layer metal trace of the type that may be used in forming a bond pad in accordance with an embodiment.

Trace 64 may be a signal line in an interconnect bus, may be a bond pad, or may form any other suitable signal path. FIG. 8 is a cross-sectional side view of an illustrative configuration for trace 64 in which trace 64 has multiple core layers 66 and multiple barrier layers 68. Sidewall protection structures 76 may be formed on the edges of each core layer 66. Multilayer structures of the type shown in FIG. 8 may be used in forming bond pads, power supply lines, and other conductive structures that benefit from the use of thick metal. In general, trace 64 may contain any suitable number of core layers and barrier layers. Illustrative configurations that include only a single core layer sandwiched between a pair of barrier layers are shown as examples.

Figure 9:
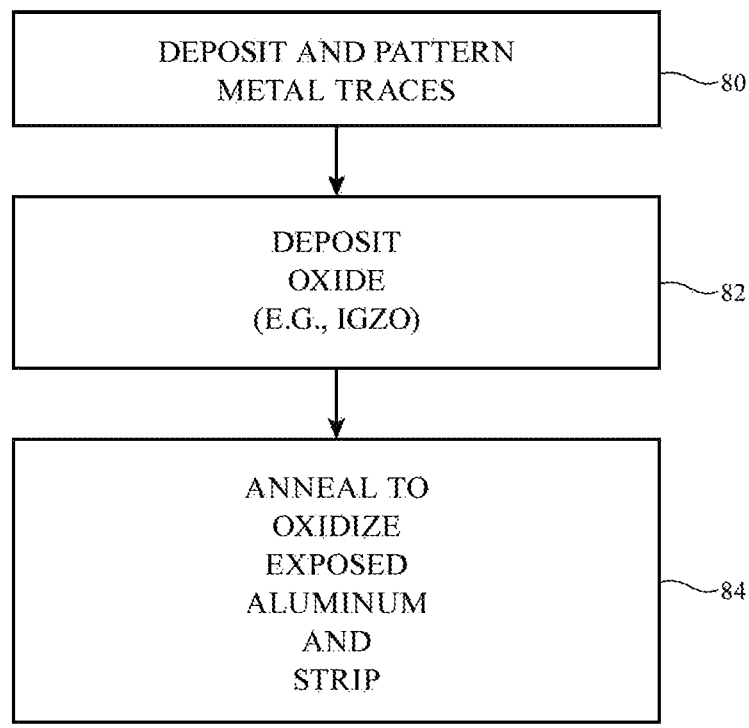
FIG. 9 is a flow chart of illustrative operations involved in forming metal traces such as the metal trace of FIG. 7 in accordance with an embodiment.

FIG. 9 is a flow chart of illustrative operations involved in forming metal trace 64 using an arrangement of the type shown in FIGS. 5, 6, and 7.

At step 80, fabrication operations such as thin-film layer deposition (e.g., physical vapor deposition, chemical vapor deposition, plasma deposition, etc.) and photolithographic patterning (e.g., photoresist exposure and patterning, metal etching, etc.) may be used to form pattern metal traces such as trace 64 of FIG. 5. At step 82, a dielectric layer such as indium gallium zinc oxide or other oxide layer may be deposited (see, e.g., layer 74). Layer 74 may cover exposed edges 72 of core layer 66 of trace 64. At step 84, an annealing operation may be performed to expose edges 72 of core layer 66 (e.g., to form aluminum oxide or other protective sidewall material for sidewalls 76). An acid etch or other treatment may then be used to remove the portions of layer 74 that have not been consumed in forming layer 76, thereby producing trace 64 of FIG. 7 (i.e., a trace with protected sidewalls).

FIGS. 10, 11, 12, and 13 are cross-sectional side views of metal trace 64 during an illustrative process of creating protective sidewalls on trace 64 by using an organic layer to pattern an inorganic layer protective layer.

Figure 10:
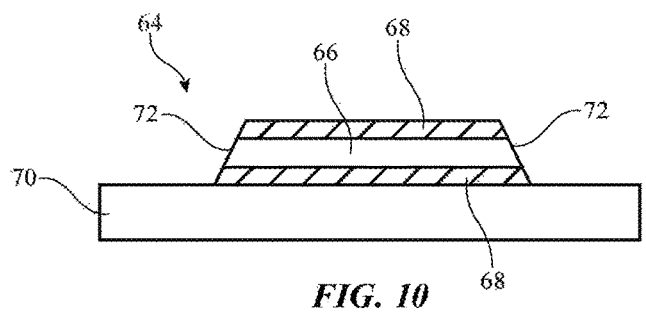
FIGS. 10, 11, 12, and 13 are cross-sectional side views of an illustrative metal trace during the process of creating protective sidewalls on the trace by using an organic layer to pattern an inorganic layer in accordance with an embodiment.

Initially, trace 64 may be deposited and patterned on layer 70 (FIG. 10).

Figure 11:
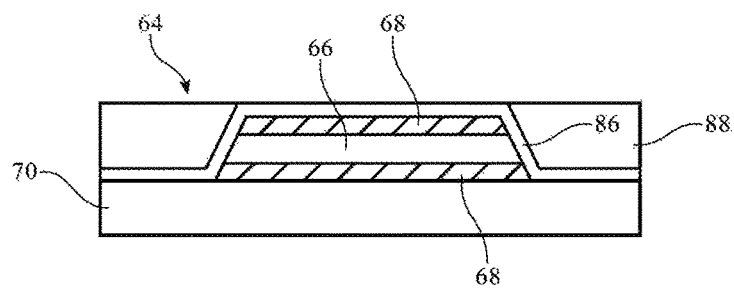

Protective inorganic dielectric layer 86 and organic layer 88 may then be deposited to cover trace 64, as shown in FIG. 11. Inorganic layer 86 may be a layer of silicon nitride, silicon oxide, silicon oxynitride, multiple layers of these materials and/or other inorganic materials that can provide a protective insulating coating for edge surfaces 72 of core layer 66 of trace 64. Organic layer 88 may be an insulating layer (e.g., spin-on glass, polymer, photoimageable polymer—i.e., photoresist, etc.). As an example, organic layer 88 may be a polymer layer, a spin-on-glass layer, or other layer that serves as a planarization layer).

Figure 12:
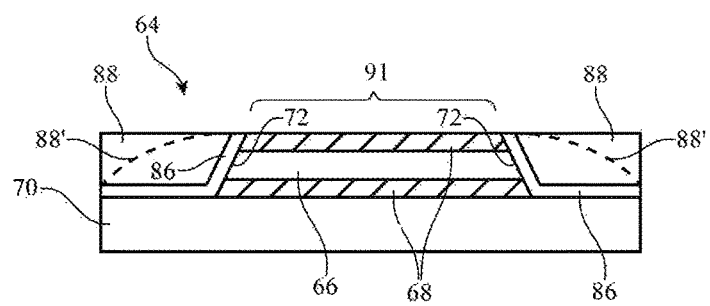
Figure 13:
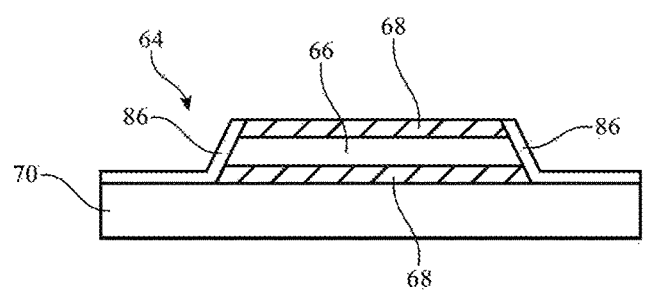

As shown in FIG. 12, the upper portion of layer 88 and the portion of layer 86 that overlaps the upper barrier layer 68 in region 91 may be removed (e.g., using a plasma oxygen etch to remove layer 88 in region 91 and using a directional etchant such as a CF4 etch, an SF6 etch, or other etchant to etch layer 86 in region 91). This exposes the surface of upper barrier layer 68 in region 91, while leaving sidewall surfaces 72 of core layer 66 in trace 64 protected by layer 86. As shown by lines 88', planarization layer 88 may be partly removed (and may therefore be non-planar) due to the processing involved in removing layers 88 and 86 in region 91. After layer 86 has been removed by etching in region 91, remaining portions of layer 88 may optionally be stripped (e.g., using a liquid organic layer stripper, an oxygen plasma, etc.). In the configuration of FIG. 13 (i.e., following stripping operations to remove layer 88), the sidewall surfaces of core layer 66 of metal trace 64 are protected by inorganic layer 86. If desired, layer 88 of FIG. 12 may be retained (e.g., to use as a planarization layer before subsequent thin-film layers are deposited and patterned over the structures of FIG. 12).

Figure 14:
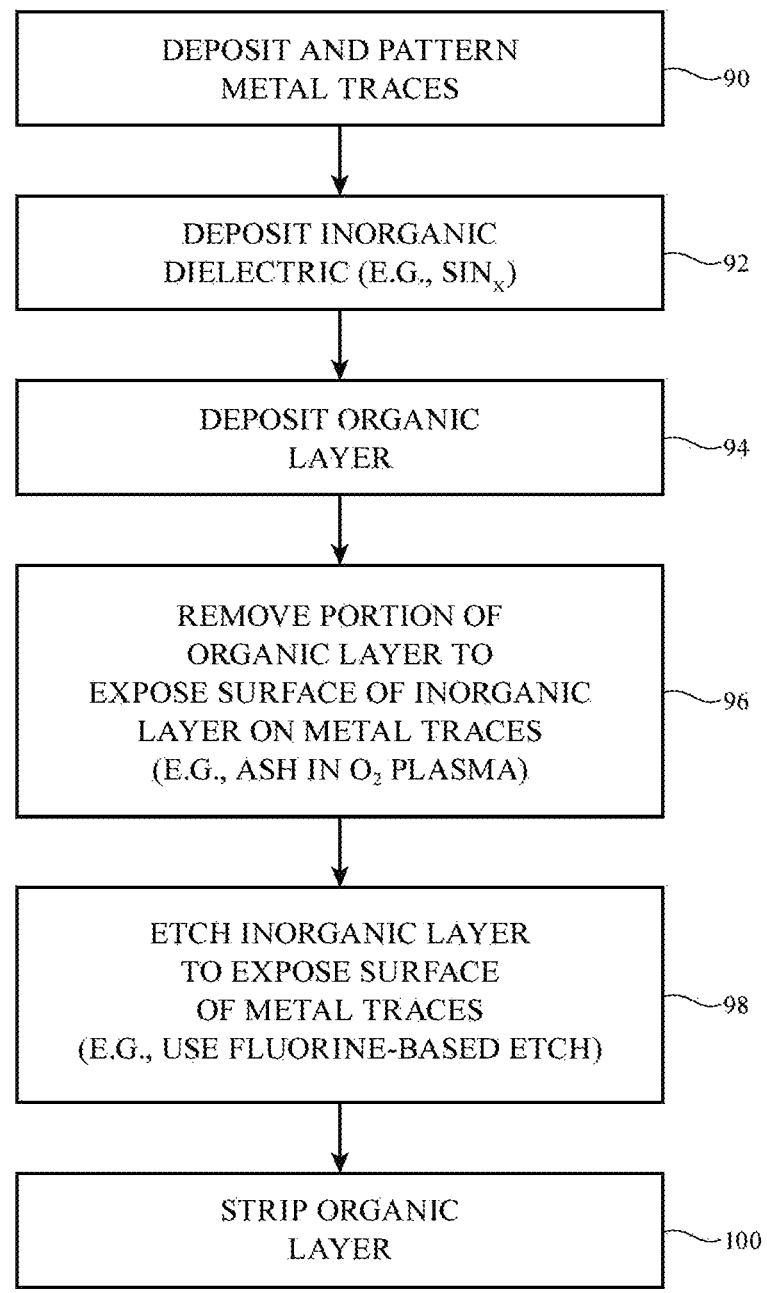
FIG. 14 is a flow chart of illustrative operations involved in forming a metal trace with protective sidewalls using techniques of the type shown in FIGS. 10, 11, 12, and 13 in accordance with an embodiment.

FIG. 14 is a flow chart of illustrative operations involved in forming a metal trace with protective sidewalls using techniques of the type shown in FIGS. 10, 11, 12, and 13.

At step 90, metal layers may be deposited and patterned on layer 70 to form metal trace 64 of FIG. 10.

At step 92, inorganic layer 86 may be formed over trace 64.

Organic layer 88 may be formed over layer 86 at step 94.

During the operations of step 96, organic layer 88 may be removed from the upper surface of trace 64 in region 91 using an oxygen plasma or other etchant.

During the operations of step 98, layer 86 may be removed using a fluorine-based plasma etchant or other etchant. Portions of layer 86 remain over the sidewalls of trace 64, thereby preventing sidewall corrosion of trace 64.

If desired, residual portion of organic layer 88 may be stripped at step 100 (e.g., using a liquid organic solvent, etc.).

FIGS. 15, 16, 17, and 18 are cross-sectional side views of metal trace 64 during an illustrative process for creating protective sidewalls using a patterned hydrophobic photoresist coating.

Figure 15:
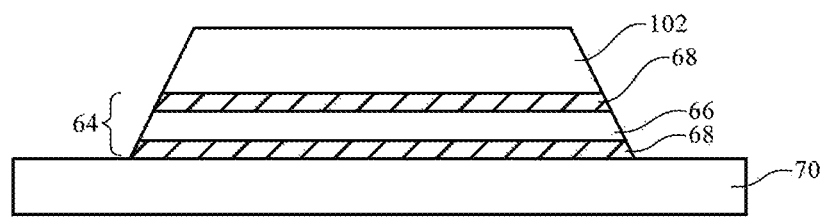
FIGS. 15, 16, 17, and 18 are cross-sectional side views of an illustrative metal trace during the process of creating protective sidewalls on the trace using a patterned hydrophobic photoresist coating in accordance with an embodiment.

Initially, layers 68 and 66 may be deposited on layer 70. Photoresist layer 102 may be patterned on top of layers 66 and 68 and an etching operation may be performed to form metal trace 64 (FIG. 15).

Figure 16:
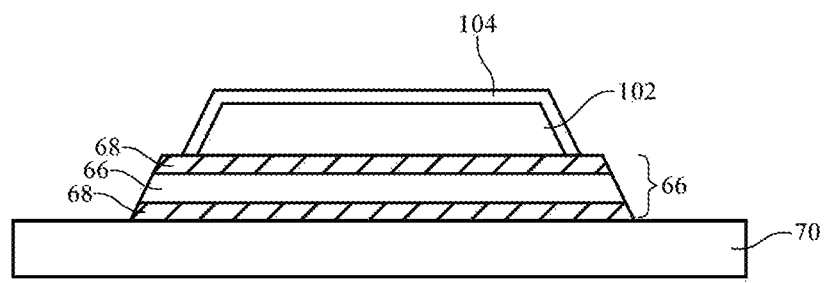

The surface of photoresist 102 may be treated using an oxygen plasma followed by a fluorine etchant or other surface treatment that creates a hydrophobic surface layer (see, e.g., hydrophobic surface 104 on patterned photoresist 102 of FIG. 16.

Figure 17:
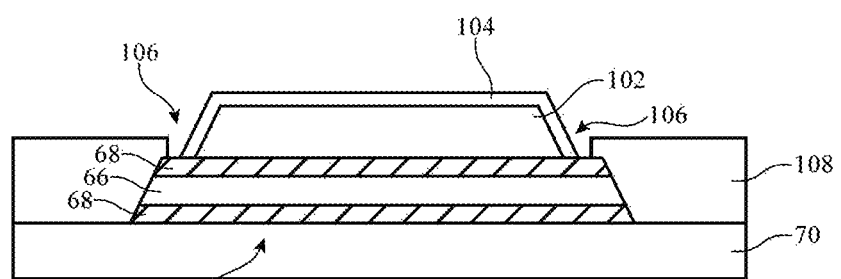

The hydrophobic nature of surface layer 104 repels planarization layer 108, thereby creating gaps such as gaps 106 between layer 108 and photoresist 102 and preventing planarization layer 108 from coating surface 104, as shown in FIG. 17. Layer 108 may be a polymer layer, a spin-on-glass layer, or other planarization layer.

Figure 18:
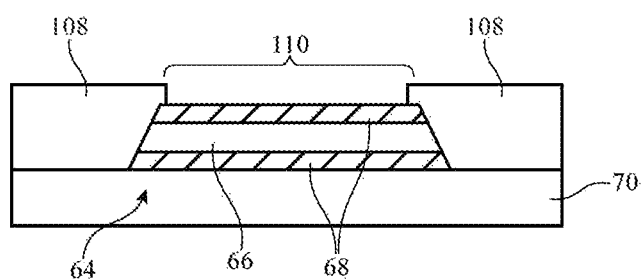

Because layer 104 is not covered by layer 108, region 110 of barrier layer 68 in trace 64 can be exposed through layer 108 following a photoresist stripping operation that removes layer 102 (FIG. 18). As shown in FIG. 18, portions of layer 108 cover the edges of core layer 66 and serve as sidewall protection structures that help prevents layer 66 from being corroded. An optional surface treatment (e.g., oxygen plasma) may be used to clean layer 68 in region 110.

Figure 19:
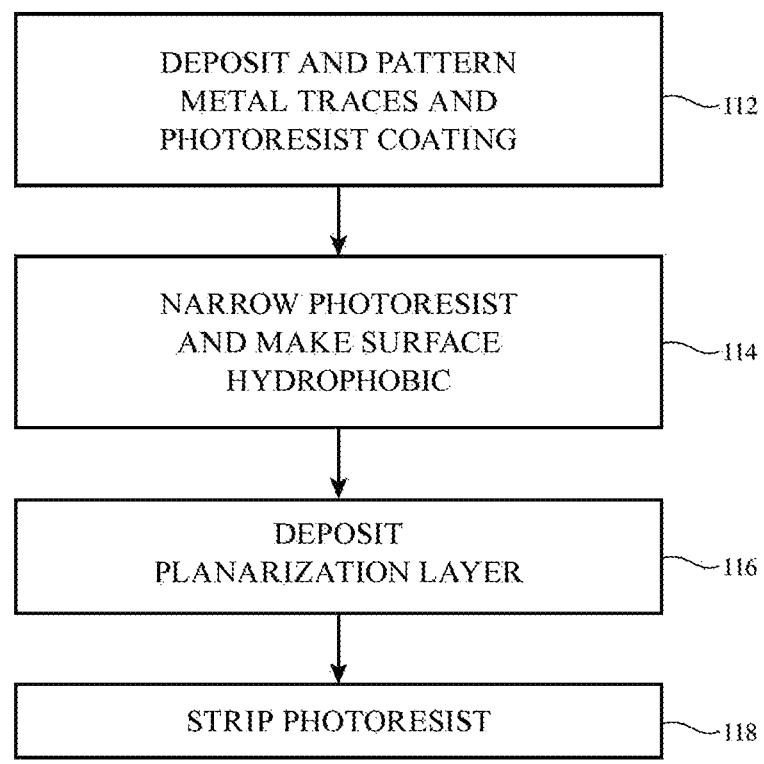
FIG. 19 is a flow chart of illustrative operations involved in forming a metal trace with protective sidewalls using the approach of FIGS. 15, 16, 17, and 18 in accordance with an embodiment.
Figure 20:
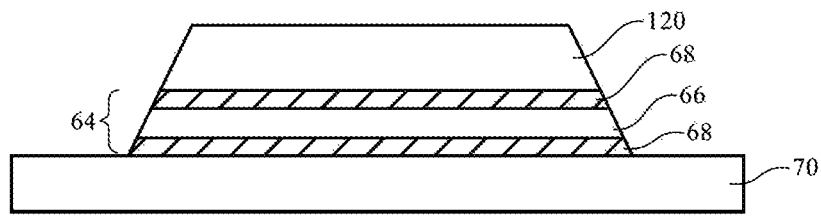
FIGS. 20, 21, 22, and 23 are cross-sectional side views of an illustrative metal trace during the process of creating protective sidewalls on the trace using a hydrophobic surface such as a roughened metal trace surface in accordance with an embodiment.

FIG. 19 is a flow chart of illustrative operations involved in forming metal trace 64 using the approach of FIGS. 17, 18, 19, and 20.

At step 112, metal layers for trace 64 are deposited and a patterned photoresist layer is formed on top of these metal layers, as shown in FIG. 15.

At step 114, the surface of the photoresist is exposed to an oxygen plasma or other suitable treatment. This may narrow the photoresist so that the photoresist only covers the center of barrier layer 68 on trace 64, as shown in FIG. 16. The surface of the photoresist is then exposed to a plasma containing a fluorine etchant or other treatment that renders the surface hydrophobic (FIG. 16).

At step 116, a planarization layer such as a polymer planarization layer, spin-on-glass, etc. is deposited. The planarization layer has portions that form protective dielectric sidewalls that protect the edges of core layer 66 of trace 64.

At step 118, photoresist layer 102 may be striped and, if desired, an oxygen plasma or other surface treatment may be applied to upper barrier layer 68 to remove residual material from layer 68.

FIGS. 20, 21, 22, and 23 are cross-sectional side views of metal trace 64 during an process of creating protective sidewalls on the trace using a hydrophobic surface such as a roughened surface of trace 64 in accordance with an embodiment.

Initially, layers 66 and 68 for trace 64 may be deposited on layer 70 and covered with a patterned photoresist layer such as layer 120. The metal layers may then be etched to form metal trace 64 of FIG. 20.

Figure 21:
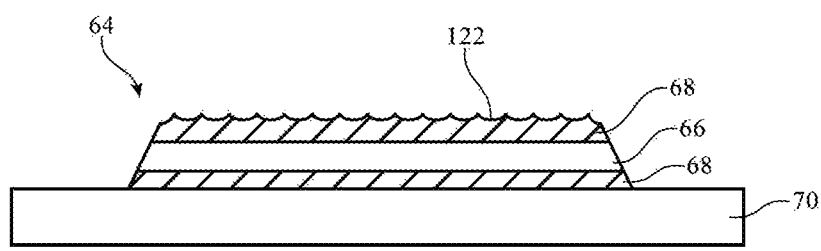

Photoresist layer 120 may be stripped using a liquid stripper (e.g., a polymer solvent). The surface of trace 64 (e.g., the surface of upper barrier layer 68) may then be roughened to form rough surface 122 using by plasma etching or other suitable roughening surface treatment (FIG. 21).

Figure 22:
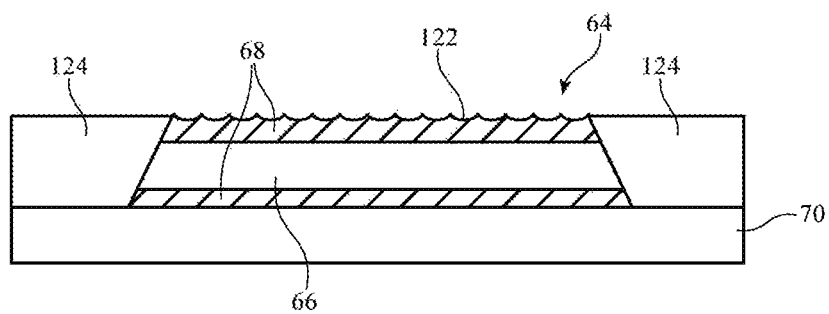

As shown in FIG. 22, planarization layer 124 (e.g., a polymer layer, a spin-on-glass layer, or other planarization layer) may then be deposited. Roughened surface 122 is hydrophobic, so layer 124 only covers portions of layer 70 where trace 64 is not present (i.e., layer 124 does not cover trace 64, because surface 122 repels layer 124).

Figure 23:
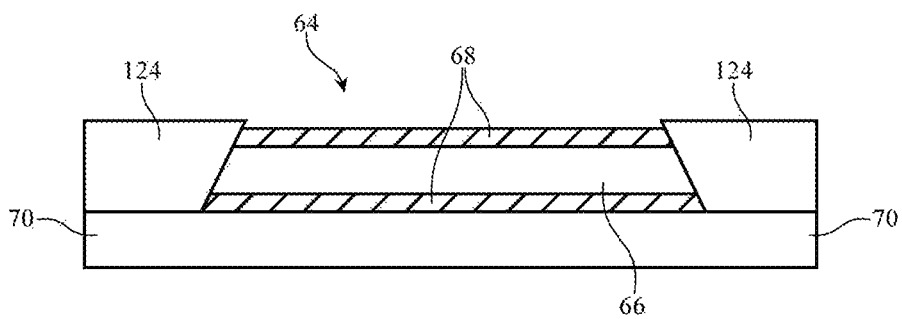

Following curing and optional surface treatment (e.g., an oxygen plasma etch to clean the surface of trace 64), trace 64 may appear as shown in FIG. 23. As shown in FIG. 23, portions of layer 124 may serve as a protective sidewall for trace 64 that helps prevent corrosion of core layer 66.

Figure 24:
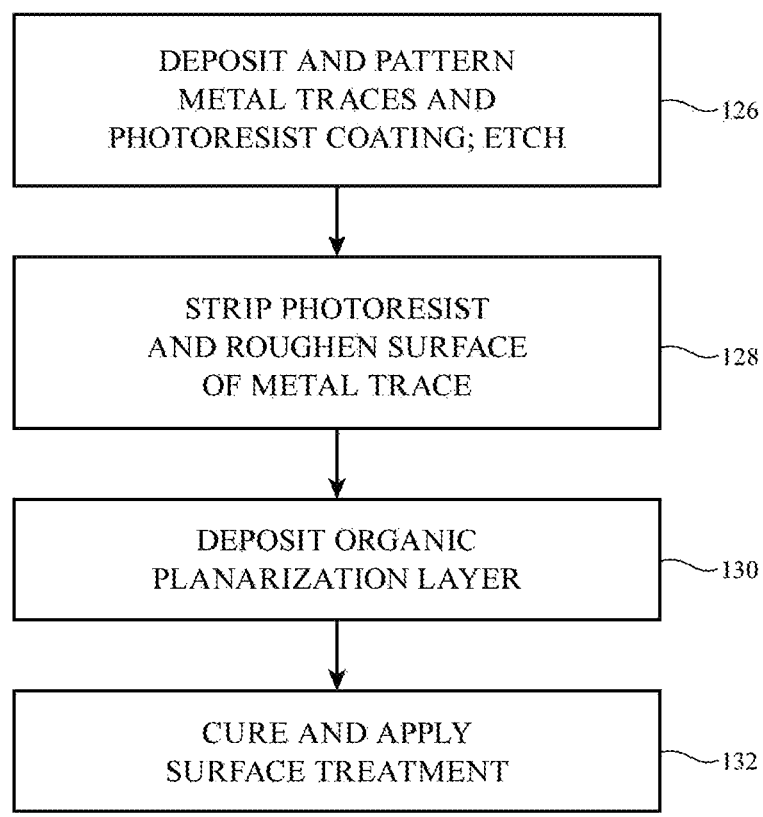
FIG. 24 is a flow chart of illustrative operations involved in forming a metal trace with protective sidewalls using the approach of FIGS. 20, 21, 22, and 23 in accordance with an embodiment.

FIG. 24 is a flow chart of illustrative operations involved in forming a metal trace with protective sidewalls using the approach of FIGS. 20, 21, 22, and 23.

Figure 30:
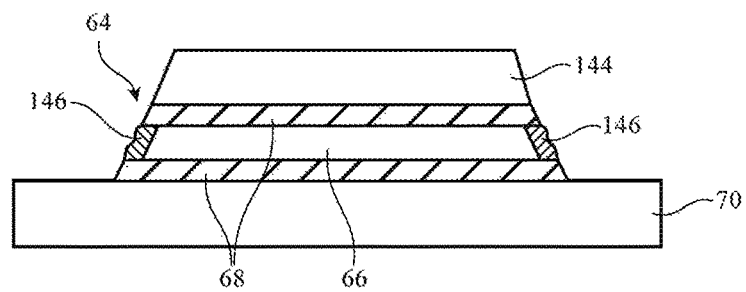

At step 126, metal layers for trace 64 may be deposited on layer 70 and covered with patterned photoresist. The metal layers may then be etched in a metal etchant to form trace 64 (FIG. 30).

Photoresist 120 may be stripped and the surface of upper barrier layer 68 in trace 64 may be roughened using a fluorine-based plasma etch or other roughening surface treatment (step 128).

At step 130, planarization layer 124 may be deposited. Due to the presence of roughened and hydrophobic surface 122, layer 124 is repelled from the surface of trace 64.

At step 132, layer 124 may be cured (e.g., by application of heat) and the surface of trace 64 may be cleaned. As shown in FIG. 23, the present of layer 124 on the sides of trace 64 may help protect trace 64 from corrosion.

Figure 25:
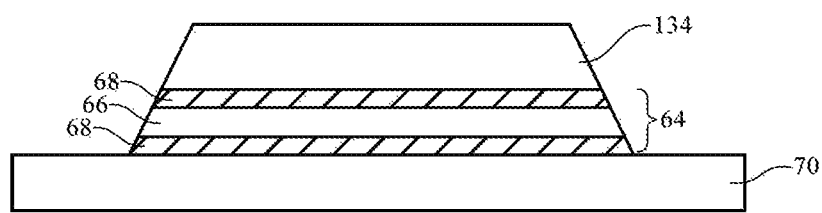
FIGS. 25 and 26 are cross-sectional side views of an illustrative metal trace with protective sidewalls formed using processes such as plasma oxidation or nitridation in accordance with an embodiment.
Figure 26:
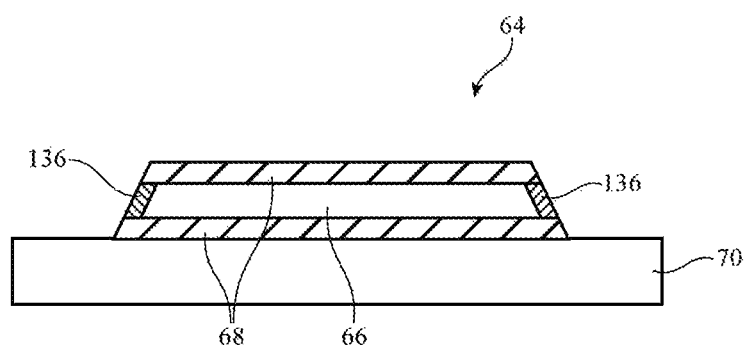

FIGS. 25 and 26 are cross-sectional side views of metal trace 64 in a configuration in which the sidewalls of trace 64 have been formed using processes such as plasma oxidation or nitridation. Initially, as shown in FIG. 25, metal layers 66 and 68 for metal trace 64 may be deposited on layer 70 and covered with patterned photoresist 134. The metal layers may then be etched to form trace 64.

After forming trace 64, photoresist 134 may be stripped using a liquid stripper or an oxygen plasma. Trace 64 may then be treated in an environment that causes protective layers 136 to grow on the exposed edges of layer 66, as shown in FIG. 26. The environment in which layers 136 are formed may be, for example, an oxygen plasma that oxidizes the exposed portions of layer 66 (i.e., a plasma that forms an oxide for layer 136), a nitrogen plasma that grows a nitride for layer 136, or other environment that promotes the oxidation or nitridation of layer 66 to form protective sidewall structure 136.

Figure 27:
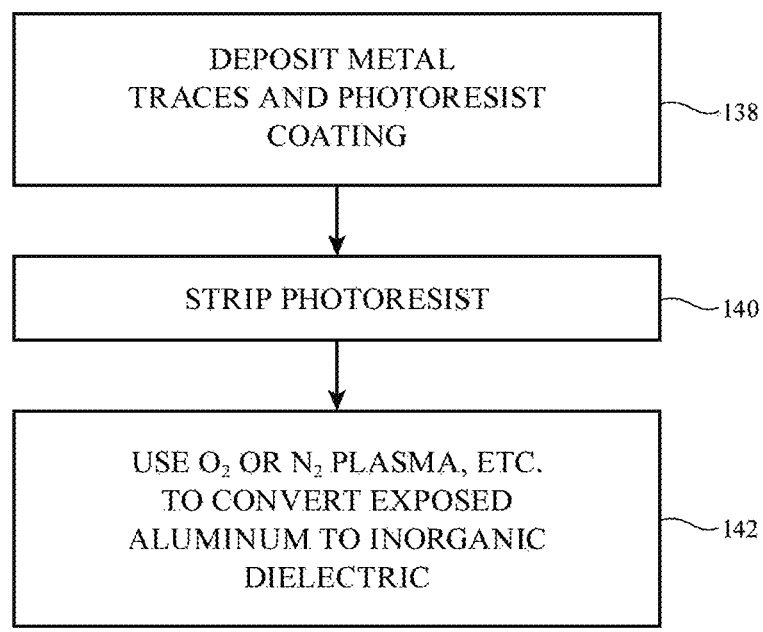
FIG. 27 is a flow chart of illustrative operations involved in forming protective sidewalls using a process of the type shown in FIGS. 25 and 26 in accordance with an embodiment.

FIG. 27 is a flow chart of illustrative operations involved in forming protective sidewalls 136 of FIG. 26 using a process of the type shown in FIGS. 25 and 26.

At step 138, metal layers 66 and 68 may be deposited and patterned using patterned photoresist 134.

Photoresist 134 may be stripped at step 140 (e.g., using an oxygen plasma, liquid photoresist strip, etc.).

After photoresist removal operations are complete, protective sidewall structures 136 may be formed on traces 64 at step 142 by oxidation and/or nitridation and/or other surface treatment of the exposed sidewall (edge) portions of trace 64 (e.g., the exposed side surfaces of core 66). If desired, residual photoresist stripping operations may then be performed (e.g., using an oxygen plasma, liquid photoresist strip, etc.). During step 142, the exposed surfaces of layer 66 in trace 64 may be converted into protective dielectric (e.g., by oxidation when layer 66 is exposed to an oxygen plasma or by nitridation when layer 66 is exposed to a nitrogen plasma, etc.). After growing protective sidewall dielectric layer 136 in this way, trace 64 will be protected from corrosion.

FIGS. 28, 29, 30, and 31 are cross-sectional side views of metal trace 64 in an arrangement in which trace 64 is being provided with protective sidewalls formed using plasma processes that undercut the upper barrier metal of trace 64.

Figure 28:
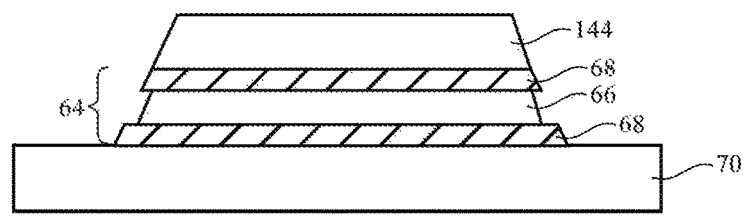
FIGS. 28, 29, 30, and 31 are cross-sectional side views of an illustrative metal trace with protective sidewalls formed using processes such as lower and higher pressure plasma processes in accordance with an embodiment.

In the configuration of FIG. 28, metal trace 64 has been patterned by depositing and patterning photoresist 144 using photolithography and by etching away metal not protected by photoresist 144. Plasma etching has been used to undercut upper barrier layer 68. The plasma etching process used for undercutting layer 68 in trace 64 may use an etchant such as a combination of $Cl_2$ and $BCl_3$ gases (as an example). A relatively high gas pressure (e.g., 20 mTorr or more as an example) may be used to help enhance undercutting (e.g., by enhancing the aluminum etch rate relative to the titanium etch rate in a scenario in which core 66 is formed from aluminum and barrier layers 68 are formed from titanium).

Figure 29:
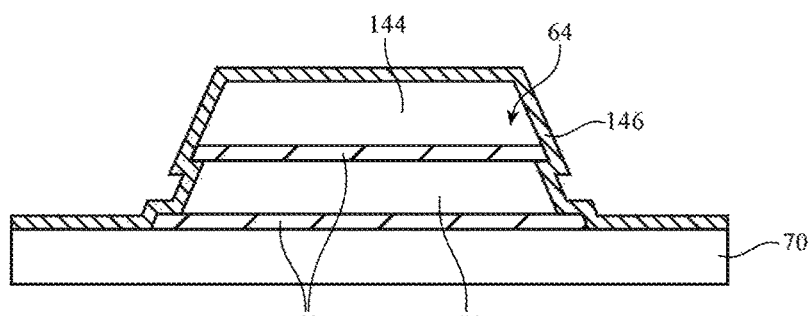

As shown in FIG. 29, a plasma process may then be used to deposit a protective film such as fluorocarbon layer 146. The process used in depositing layer 146 may be, for example a $CF_4$ (or $C_4F_8$) or other fluorine-based plasma deposition process (repo-mode) that deposits a thin polymer film. Layer 146 covers photoresist 144, the exposed edges of core 66 and other portions of trace 64 and layer 70.

As shown in FIG. 30, layer 146 may be selectively removed using a low-pressure high-bias oxygen plasma process (ash) or other suitable selective film removal process. The low-pressure oxygen plasma may, for example, be performed using an oxygen pressure of 10 mTorr or less. The undercut area of trace 64 is protected from the oxygen plasma by overhanging edge portions of metal layer 68, so layer 146 is removed everywhere except on the undercut portion of trace 64 (i.e., the portion of trace 64 on the exposed edge surfaces of core 66).

Figure 31:
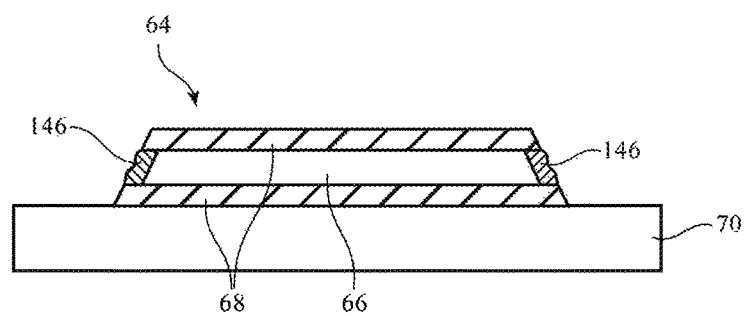

After selective removal of layer 146, photoresist 144 may be stripped from trace 64. After photoresist removal, trace 64 has protected sidewall portions (portions in which core sidewall surfaces are covered with portions of protective layer 164), as shown in FIG. 31.

Figure 32:
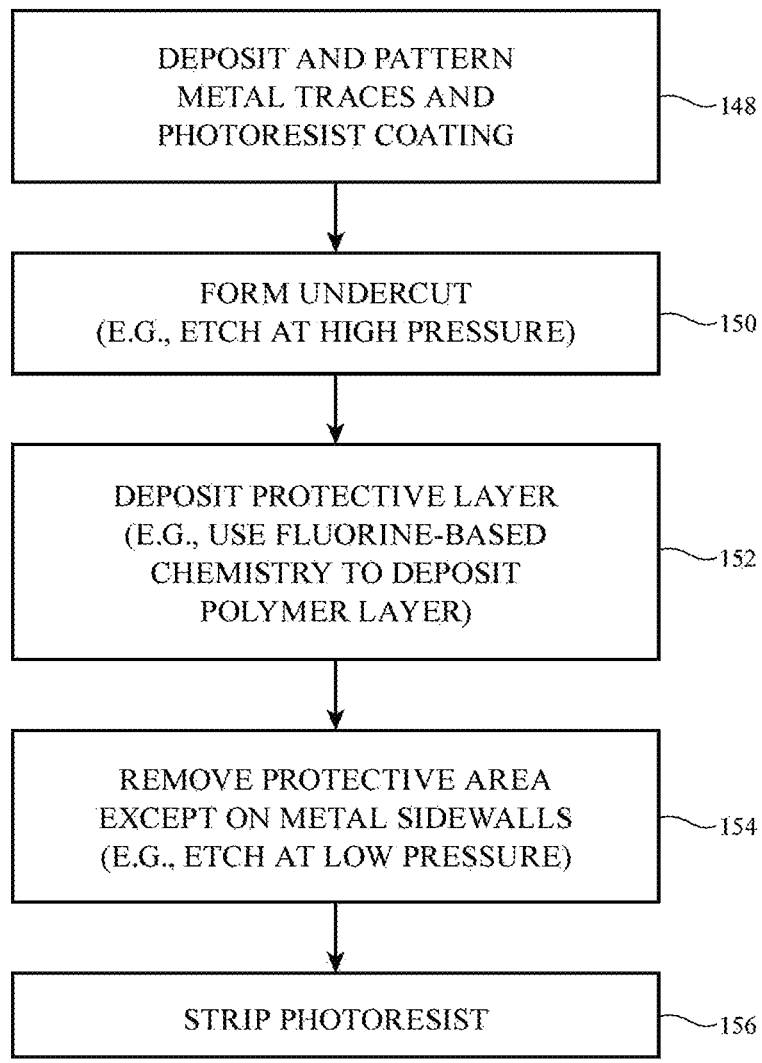
FIG. 32 is a flow chart of illustrative operations involved in forming protective sidewalls using a process of the type shown in FIGS. 28, 29, 30, and 31 in accordance with an embodiment.

FIG. 32 is a flow chart of illustrative operations involved in forming protective sidewalls using a process of the type shown in FIGS. 28, 29, 30, and 31.

At step 148, metal layers 68 and 66 may be deposited. Photoresist 144 may be deposited and patterned, and trace 64 may be formed by etching. During the etching process of step 148 and/or during undercut etching with a high-pressure plasma at step 150, barrier layer 68 (and therefore photoresist 144) may be undercut due to the preferential etching of core layer 66 relative to other layers.

At step 152, a plasma deposition process may be used to deposite protective layer 146 of FIG. 29.

At step 154, a low-pressure plasma process may be used to remove layer 146 except along the sidewalls of trace 64 (i.e., on the edges of core 66). Following photoresist striping with a liquid stripper or other suitable photoresist removal technique (step 156), trace 64 will appear as shown in FIG. 31 with protective sidewall portions of layer 146 covering the sidewall surfaces of core 66.

Figure 33:
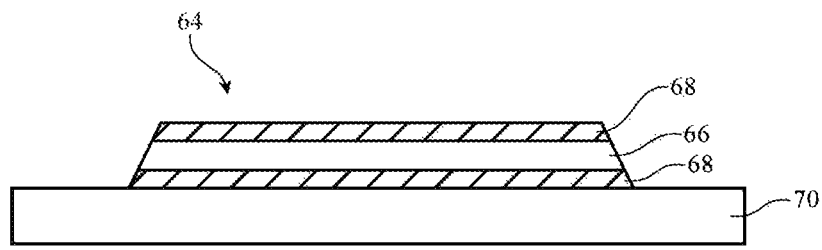
FIGS. 33, 34, and 35 are cross-sectional side views of an illustrative metal trace with protective sidewalls formed using a liquid oxidizer in accordance with an embodiment.
Figure 34:
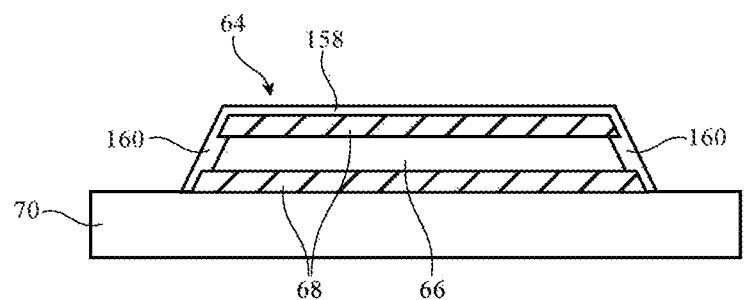
Figure 35:
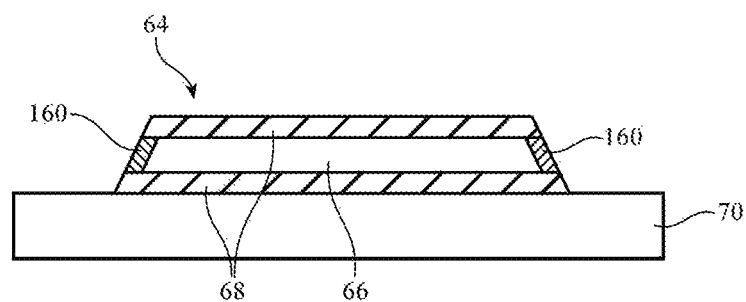

FIGS. 33, 34, and 35 are cross-sectional side views of metal trace 62 while being provided with protective sidewalls formed using a liquid oxidizer.

As shown in FIG. 33, trace 64 may initially have protective barrier layers 68 and a core layer 66 sandwiched between barrier layers 68.

Following immersion in a liquid oxidizer such as $O_3$ water or $H_2O_2$, the exposed surfaces of trace 64 oxidize to form oxide layer 158 on barrier layers 68 and oxide layer 160 on the exposed edges of core layer 66. With one suitable arrangement, layers 68 are formed from titanium and core layer 66 is formed from aluminum. The liquid oxidizer will tend to oxidize titanium (e.g., the upper barrier layer 68) less than aluminum (e.g., the exposed edges of core 66), so layer 158 will tend to be thinner than layer 160 (i.e., aluminum oxide layer 160 will be thicker than titanium oxide layer 158).

A surface treatment can be applied to trace 64 after oxidation. The surface treatment may be, for example, a $CF_4$ plasma etching gas or other etching gas that etches titanium oxide faster than aluminum oxide. Due to the preferential etch rates between titanium oxide over aluminum oxide and/or the thinner layer thickness of layer 158 relative to layer 160, only layer 160 on the edges of core 66 remains after the surface treatment, as shown in FIG. 35. By leaving the surface of trace 64 (i.e., the exposed planar upper surface of layer 68) exposed as shown in FIG. 35 and the other FIGS., trace 64 may be satisfactorily used in forming a bond pad and/or an interconnect line that makes contact with other metal traces in component 40.

Figure 36:
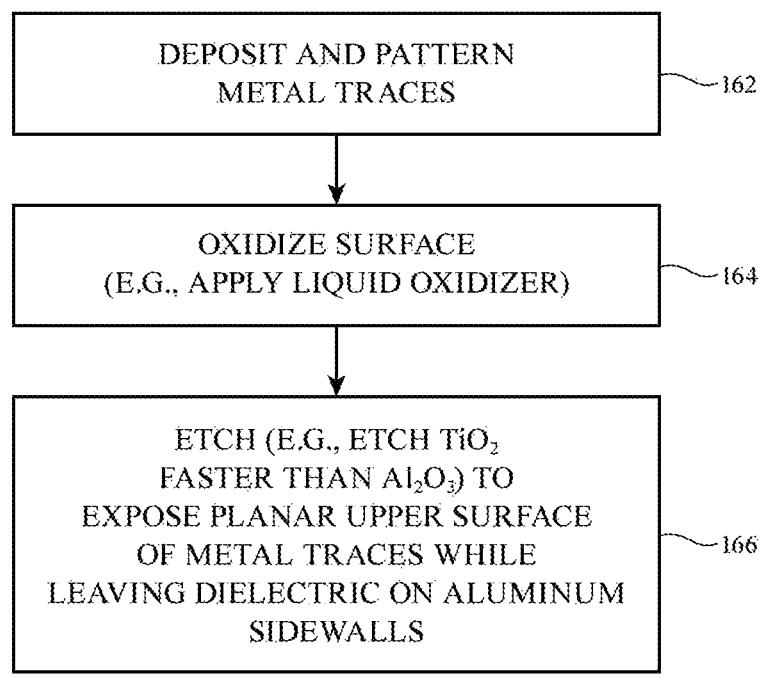
FIG. 36 is a flow chart of illustrative steps involved in forming protective sidewalls on a metal trace using an approach of the type shown in FIGS. 33, 34, and 35 in accordance with an embodiment.

FIG. 36 is a flow chart of illustrative steps involved in forming protective sidewalls on metal trace 64 using an approach of the type shown in FIGS. 33, 34, and 35.

At step 162, metal may be deposited and patterned to form trace 64 of FIG. 33.

At step 164, oxide layers 158 and 160 of FIG. 34 may be grown by applying a surface treatment such as a liquid oxidizer.

At step 166, a plasma etch or other process may be used to remove film 158 will leaving layers 160 on the sidewalls of trace 64 in place. This forms trace 64 of FIG. 35 in which oxide layers 160 forms protective sidewall for core 66 of trace 64.

The foregoing is merely illustrative and various modifications can be made by those skilled in the art without departing from the scope and spirit of the described embodiments. The foregoing embodiments may be implemented individually or in any combination.

What is claimed is:

1. A method, comprising:
   forming a conductive trace that has a core layer sandwiched between and directly and physically contacting first and second titanium barrier layers; and
   processing edge surfaces of the core layer in the conductive trace to form protective sidewall structures on the edge surfaces of the core layer, wherein processing the edge surfaces comprises:
   depositing a layer of material over the edge surfaces, and
   annealing the layer of material so that the layer of material reacts with the edge surfaces.

2. The method defined in claim 1 wherein the core layer is a core metal layer and wherein forming the conductive trace comprises forming the conductive trace with the core metal layer.

3. The method defined in claim 2 wherein depositing the layer of material comprises applying a surface treatment to the edge surfaces that converts the edge surfaces of the core metal layer into the protective sidewall structures and wherein the protective sidewall structures are dielectric.

4. The method defined in claim 2 wherein the layer of material comprises an oxide layer and wherein the annealing comprises heating the oxide layer and the core metal layer so that oxygen from the oxide layer oxidizes the edge surfaces of the core metal layer and thereby forms the protective sidewall structures.

5. The method defined in claim 2 wherein the layer of material comprises indium gallium zinc oxide and wherein the annealing comprises heating the indium gallium zinc oxide and the core metal layer so that the core metal layer oxidizes using oxygen from the indium gallium zinc oxide to form the protective sidewall structures.

6. The method defined in claim 2 wherein the core metal layer comprises aluminum.

7. The method defined in claim 2 further comprising:
forming a display having an array of pixels that includes the conductive trace.

8. A method, comprising:
forming a metal trace with edge surfaces, wherein the metal trace has a core metal layer sandwiched between first and second barrier metal layers;
applying a layer of material over the edge surfaces; and
reacting the layer of material with the edge surfaces to form protective sidewall structures on the edge surfaces of the core metal layer.

9. The method defined in claim 8 wherein applying the layer of material over the edge surfaces comprises applying an oxide layer and wherein reacting the layer of material comprises oxidizing the edge surfaces of the core metal layer to form the protective sidewall structures.

10. The method defined in claim 8 wherein reacting the layer of material with the edge surfaces comprises annealing the layer of material so that the layer of material reacts with the edge surfaces.

11. The method defined in claim 10 wherein the layer of material comprises indium gallium zinc oxide and wherein the annealing comprises heating the indium gallium zinc oxide and the core metal layer so that the core metal layer oxidizes using oxygen from the indium gallium zinc oxide to form the protective sidewall structures.

12. A method, comprising;
forming a conductive trace with edge surfaces, wherein the conductive trace has a core layer between first and second barrier layers;
depositing an oxide layer over the conductive trace; and
annealing the oxide layer so that the oxide layer reacts with the edge surfaces to form protective sidewall structures on the edge surfaces.

* * * * *